(12) United States Patent
Kleemann et al.

(10) Patent No.: US 9,705,098 B2
(45) Date of Patent: Jul. 11, 2017

(54) METHOD FOR PRODUCING AN ORGANIC FIELD EFFECT TRANSISTOR AND AN ORGANIC FIELD EFFECT TRANSISTOR

(71) Applicant: Novaled GmbH, Dresden (DE)

(72) Inventors: Hans Kleemann, Dresden (DE); Bjoern Luessem, Dresden (DE); Karl Leo, Dresden (DE); Alrun Guenther, Dresden (DE)

(73) Assignee: Novaled GmbH, Dresden (DE)

( * ) Notice: Subject to any disclaimer, the term of this patent is extended or adjusted under 35 U.S.C. 154(b) by 0 days.

(21) Appl. No.: 14/783,229

(22) PCT Filed: Apr. 15, 2014

(86) PCT No.: PCT/EP2014/057651
§ 371 (c)(1),
(2) Date: Oct. 8, 2015

(87) PCT Pub. No.: WO2014/173738
PCT Pub. Date: Oct. 30, 2014

(65) Prior Publication Data
US 2016/0049603 A1    Feb. 18, 2016

(30) Foreign Application Priority Data

Apr. 23, 2013 (EP) .................... 13164959

(51) Int. Cl.
*H01L 35/24* (2006.01)
*H01L 51/05* (2006.01)
(Continued)

(52) U.S. Cl.
CPC .......... *H01L 51/057* (2013.01); *H01L 51/002* (2013.01); *H01L 51/105* (2013.01); *H01L 51/5296* (2013.01); *H01L 51/0018* (2013.01)

(58) Field of Classification Search
CPC ................... H01L 51/0038; H01L 51/0545
(Continued)

(56) References Cited

U.S. PATENT DOCUMENTS 7,202,547 B2    4/2007   Klauk et al.
7,208,782 B2    4/2007   Klauk et al.
(Continued)

FOREIGN PATENT DOCUMENTS

| JP | 2003-243411 A | 8/2003 |
|---|---|---|
| WO | 2010/113163 A1 | 10/2010 |
| WO | 2011139774 A2 | 11/2011 |

OTHER PUBLICATIONS

PCT International Search Report for PCT Application No. PCT/EP2014/057651 mailed Jul. 1, 2014 (3 pages).
(Continued)

*Primary Examiner* — Samuel Gebremariam
(74) *Attorney, Agent, or Firm* — Eversheds Sutherland (US) LLP

(57) ABSTRACT

The disclosure relates to a method for producing an organic field effect transistor, including providing a gate electrode and a gate insulator, depositing a first organic semiconducting layer on the gate insulator, generating a first electrode and an electrode insulator assigned to the first electrode for electrical insulation, depositing a second organic semiconducting layer on the first organic semiconducting layer and the electrode insulator, and generating a second electrode. Furthermore, an organic field effect transistor is provided.

16 Claims, 4 Drawing Sheets

Figure 1:
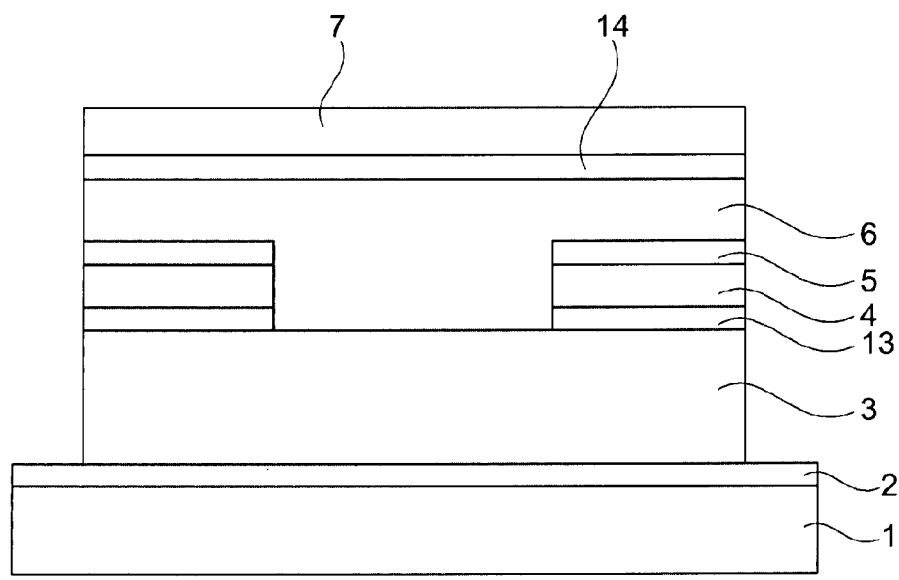

(51) Int. Cl.
*H01L 51/00* (2006.01)
*H01L 51/10* (2006.01)
*H01L 51/52* (2006.01)

(58) Field of Classification Search
USPC .......................... 257/40, E25.008, E33.001
See application file for complete search history.

(56) References Cited

U.S. PATENT DOCUMENTS

| | | | |
|---|---|---|---|
| 7,863,600 | B2 | 1/2011 | Nomoto |
| 8,431,448 | B2 | 4/2013 | Obata et al. |
| 2009/0179189 | A1 | 7/2009 | Werner et al. |
| 2009/0179208 | A1 | 7/2009 | Obata et al. |
| 2009/0315043 | A1 | 12/2009 | Nakamura et al. |
| 2014/0203254 | A1 | 7/2014 | Dorok et al. |

OTHER PUBLICATIONS

Ben-Sasson et al., "Patterned Electrode Vertical Field Effect Transistor Fabricated Using Block Copolymer Nanotemplates," Applied Physics Letters, 2009, 95:213301-1-213301-3.
Blockwitz et al., "Low Voltage Organic Light Emitting Diodes Featuring Doped Phthalocyanine as Hole Transport Material," Applied Physics Letters, 1998, 73(6):729-731.
D'Andrade et al., "Operational Stability of Electrophosphorescent Devices Containing p and n Doped Transport Layers," Applied Physics Letters, 2003, 83(19):3858-3860.
Gao et a.., "Controlled p-Doping of Zinc Phthalocyanine by Coevaporation with Tetrafluorotetracyanoquinodimethane: A Direct and Inverse Photoemission Study," Applied Physics Letters, 2001, 79(24):4040-4042.
Nakamura et al., "Metal-Insulator-Semiconductor-Type Organic Light-Emitting Transistor on Plastic Substrate," Applied Physics Letters, 2006, 89:103525-1-103525-3.
Walzer et al., "Highly Efficient Organic Devices Based on Electrically Doped Transport Layers," Chem. Rev., 2007, 107:1233-1271.
Japanese Office Action for JP Application No. 2016-509384 mailed Oct. 4, 2016 (English translation) (4 pages).

METHOD FOR PRODUCING AN ORGANIC FIELD EFFECT TRANSISTOR AND AN ORGANIC FIELD EFFECT TRANSISTOR

CROSS REFERENCE TO RELATED APPLICATIONS

This application is a U.S. national stage application of PCT/EP2014/057651, filed Apr. 15, 2014, which claims priority to European Application No. 13164959.2, filed Apr. 23, 2013. The contents of these applications are hereby incorporated by reference.

The invention relates to a method for producing an organic field effect transistor and an organic field effect transistor.

BACKGROUND OF THE INVENTION

For a realization of flexible and electronic components based on organic semiconducting elements it is necessary to develop capable and robust organic transistors. A promising approach is provided by vertical organic field effect transistors (VOFETs).

A VOFET (as field effect transistors in general) is formed with three electrodes, namely a gate electrode, a source electrode and a drain electrode. In a VOFET, the source electrode and the drain electrode are connected with each other by an organic semiconductor. The gate electrode is separated from the source electrode and the drain electrode by an insulator. The elements of the VOFET are formed as a stack on a substrate, wherein the stack has one of the following sequences of layers: substrate/gate electrode/insulator/source electrode/drain electrode or substrate/drain electrode/source electrode/insulator/gate electrode. The organic semiconductor is always arranged between the source electrode and the drain electrode. Additionally, it can be arranged between the insulator and the source electrode. Two methods are known for producing a VOFET: self-organization of the materials and technical structuring, for example with a shadow mask.

The document WO 2010/113163 A1 discloses a vertical organic field effect transistor and a method for producing the same. The transistor comprises a patterned electrode structure which is enclosed between a dielectric layer and an active element. The active element is either an organic semiconductor or an amorphous semiconductor. The electrode structure is patterned by using a block copolymer material as a patterning mask. Hereby, the thickness of the patterned layer and lateral feature size can be selected.

A method for forming an organic device having a patterned conductive layer is disclosed in document WO 2011/139774. The method comprises the steps of depositing an organic layer on a substrate and coating the organic layer with a photoresist solution to form a photo-patternable layer. The photoresist solution includes a fluorinated photoresist material and a fluorinated solvent. Selected portions of the photo-patternable layer are radiated to form a pattern. A conductive layer is coated over the organic layer. A portion of the conductive layer is removed to form a patterned conductive layer.

K. Nakamura et al., Applied Physics Letters Vol. 89, page 103525 (2006) discloses an organic light emitting transistor. A gate electrode is arranged on a substrate and covered by a gate insulating layer. A semiconducting layer is coated on the gate insulating layer. A source electrode, an insulating layer, and a hole transporting layer are arranged on the semiconducting layer. Further, the transistor comprises an emitting layer and a drain electrode.

There is a need to provide a transistor design which allows high current densities in the device and which can be produced in an easy and controllable manner.

SUMMARY OF THE INVENTION

It is the object of the invention to provide a method for producing an organic field effect transistor and an organic field effect transistor, wherein the organic field effect transistor has a high current density.

This object is solved by a method for producing an organic field effect transistor, the method comprising steps of providing a gate electrode and a gate insulator assigned to the gate electrode for electrical insulation on a substrate, depositing a first organic semiconducting layer on the gate insulator, generating a first electrode and an electrode insulator assigned to the first electrode for electrical insulation, depositing a second organic semiconducting layer on the first organic semiconducting layer and the electrode insulator, and generating a second electrode, wherein the method further comprises at least one of the following steps generating a first doping material layer on the first organic semiconducting layer prior to generating the first electrode and the electrode insulator such that the first electrode with the electrode insulator are generated at least partially on the first doping material layer, and generating a second doping material layer on the second organic semiconducting layer prior to generating the second electrode such that the second electrode is generated at least partially on the second doping material layer; and an organic field effect transistor comprising: a first electrode and a second electrode, the electrodes providing a source electrode and a drain electrode, a gate electrode, a gate insulator provided between the gate electrode and the first electrode, an electrode insulator provided between the first and the second electrode, a first organic semiconducting layer provided between the gate insulator and the first electrode, a second organic semiconducting layer provided between the first organic semiconducting layer and the second electrode, and at least one of the following layers a first doping material layer which is provided between the first electrode and the first organic semiconducting layer and which is at least partially in direct contact with the first electrode, and a second doping material layer which is provided between the second electrode and the second organic semiconducting layer and which is at least partially in direct contact with the second electrode.

According to one aspect of the invention, a method for producing an organic field effect transistor is provided. The method comprises steps of providing a gate electrode and a gate insulator assigned to the gate electrode for electrical insulation on a substrate, depositing a first organic semiconducting layer on the gate insulator, generating a first electrode and an electrode insulator assigned to the first electrode for electrical insulation, depositing a second organic semiconducting layer on the first organic semiconducting layer and the electrode insulator, and generating a second electrode. Further, the method comprises at least one of the following steps: generating a first doping material layer on the first organic semiconducting layer prior to generating the first electrode and the electrode insulator such that the first electrode with the electrode insulator are generated at least partially on the first doping material layer, and generating a second doping material layer on the second organic semiconducting layer prior to generating the second electrode such that the second electrode is generated at least partially on the second doping material layer.

According to another aspect of the invention, an organic field effect transistor is provided, comprising a first electrode and a second electrode, the electrodes providing a source electrode and a drain electrode, a gate electrode, a gate insulator provided between the gate electrode and the first electrode, an electrode insulator provided between the first and the second electrode, a first organic semiconducting layer provided between the gate insulator and the first electrode, a second organic semiconducting layer provided between the first organic semiconducting layer and the second electrode, and at least one of the following layers: a first doping material layer which is provided between the first electrode and the first organic semiconducting layer and which is at least partially in direct contact with the first electrode, and a second doping material layer which is provided between the second electrode and the second organic semiconducting layer and which is at least partially in direct contact with the second electrode. The first and second organic semiconducting layers can be configured to transport charge carriers of the same type, namely holes and electrons. Alternatively or in addition, the first and second organic semiconducting layers can be configured to transport both carrier types, namely holes and electrons.

The invention refers to a vertical transistor design. The first and second electrode each provides a contact for applying a voltage to the transistor. The gate electrode provides a contact for controlling the state of the transistor. By the electrode insulator a parallel resistance of the transistor is reduced and the ratio between the current in an ON-state and the current in an OFF-state is increased.

In an exemplary embodiment the method comprises steps of providing a gate electrode and a gate insulator assigned to the gate electrode for electrical insulation on a substrate, depositing a first organic semiconducting layer on the gate insulator, generating a first doping material layer on the first organic semiconducting, generating a first electrode and an electrode insulator assigned to the first electrode for electrical insulation at least partially on the first doping material layer, depositing a second organic semiconducting layer on the first organic semiconducting layer and the electrode insulator, and generating a second electrode on the second semiconducting layer.

In another embodiment the method comprises steps of providing a gate electrode and a gate insulator assigned to the gate electrode for electrical insulation on a substrate, depositing a first organic semiconducting layer on the gate insulator, generating a first electrode and an electrode insulator assigned to the first electrode for electrical insulation on the first semiconducting layer, depositing a second organic semiconducting layer on the first organic semiconducting layer and the electrode insulator, generating a second doping material layer on the second organic semiconducting layer, and generating a second electrode at least partially on the second doping material layer.

In an alternative embodiment the method comprises steps of providing a gate electrode and a gate insulator assigned to the gate electrode for electrical insulation on a substrate, depositing a first organic semiconducting layer on the gate insulator, generating a first doping material layer on the first organic semiconducting layer, generating a first electrode and an electrode insulator assigned to the first electrode for electrical insulation at least partially on the first doping material layer, depositing a second organic semiconducting layer on the first organic semiconducting layer and the electrode insulator, generating a second doping material layer on the second organic semiconducting layer, and generating a second electrode at least partially on the second doping material layer.

The first and second electrode may be generated such that they completely cover the first and second doping material layer, respectively.

VOFETs in general have an asymmetric response for positive and negative Drain-Source voltages $V_{SD}$ caused by the different electrical field from the gate electrode to the source and drain electrodes, due to the different distances of the source and drain electrodes to the gate insulator. It was found that by using a first doping material layer between the source electrode and the first semiconducting layer and/or a second doping material layer between the drain electrode and the second organic semiconducting layer, respectively, it is possible to control the asymmetry. Preferably, the first and/or second doping material layers have a thickness of less than 5 nm, respectively.

In a hole transport layer (HTL) the mobility of holes is larger than the mobility of electrons. In an electron transport layer (ETL) the mobility of electrons is larger than the mobility of holes.

The first and second organic semiconducting layers are generated in separated steps. At least one of the first and second organic semiconducting layers may be made completely of a matrix material. There is a junction at the interface of one of the first or second electrode to the organic semiconducting material, namely a Schottky barrier. The junction depends on the polarity of the electrode (acting as source electrode or drain electrode). The Schottky barrier is modulated by the field from the gate insulator. An injection barrier only forms if the material of the adjacent organic semiconducting layer is not doped, and free of an injection layer. The path between the first electrode and the second electrode is mainly for transport only in this case.

Alternatively, at least one of the first or second organic semiconducting layer is doped which reduces asymmetric properties of the transistor. A doped layer comprises a matrix material and at least one dopant. The doped layer may be made of the matrix material and one dopant, preferentially of more than 90% (mol) of the matrix material, even more preferable of more than 95 mol %. If one or both of the organic semiconducting layers is doped, the first and second organic semiconducting layers preferentially comprise matrix materials configured to transport the same type of charge carriers. It is even more preferred that the organic matrix material of both layers is the same material.

Preferentially, all organic semiconducting materials have singlet excitation energies equal or smaller than 2 eV, preferably smaller than 1.85 eV, and/or the singlet transition is forbidden. The singlet excitation energy is calculated from the photon energy of the wavelength of the absorption peak (maximum of the singlet peak), which implies that the emission is smaller than 1.83 eV plus the binding energy, which is typically in the infrared. Thus, the materials do not emit visible light.

In one embodiment of the method at least one of the step of generating the first electrode and the electrode insulator, the step of generating the first doping material layer, the step of generating the second electrode and the step of generating the second doping material layer comprises a step of photo-lithographic structuring on the first and the second organic semiconducting layer, respectively. It is known to produce VOFETs using shadow masking. These VOFETs have a small specific edge length. With photo-lithographic structuring the edge length can be maximized while using a technical well controllable procedure. A high performance device is provided without requiring sophisticated lithography equipment. Common equipment with resolution and alignment registry of about 1 μm is more than sufficient to produce the transistor. Preferably, the first and/or second doping material layers are generated after applying the photolithographic mask but before depositing the first and second electrode, respectively. By this, doping may be restricted to areas attached to the respective contact materials. In principle, this may be realized by a shadow masking process.

In a preferred embodiment, the first doping material layer and/or the second doping material layer are generated by physical vapour deposition, in particular by thermal evaporation. Hereby, the step of generating the first and/or second doping material layer can be integrated in known production processes in a simple manner.

In another embodiment, the first doping material layer and/or the second doping material layer are made of a pure electrical dopant material, respectively. The first doping material layer and the second doping material layer can be made of the same pure electrical dopant material. Alternatively, both doping material layers can be made of different pure electrical dopant materials.

In an alternative embodiment the first doping material layer and/or the second doping material layer comprise a matrix material including an electrical dopant material, respectively. The first doping material layer and the second doping material layer can comprise the same matrix material including the same electrical dopant material. Alternatively, both doping material layers can comprise the same matrix material including different electrical dopant materials. In another alternative, both doping material layers can comprise different matrix materials with either the same or different electrical dopant materials. In a layer comprising a matrix material and an electrical dopant material, the dopant material may exist in a ratio of less than 5 mol % in the layer, preferably less than 2 mol %. The matrix materials used in the first and second doping material layers can be the same or can be different from the first and second organic semiconducting layer. If they are different they may have a lower mobility.

The dopants used for generating the first and second doping material layer, either as pure dopant material or in a matrix/dopant system, can be small organic molecules. The matrix material can be an organic semiconducting material. The thickness of the first and/or second doping material layer is preferably less than 2.5 nm, more preferably equal to or less than 1 nm.

In a preferred embodiment, the first and second organic semiconducting layers comprise the same organic matrix material. At least one of the first and second organic semiconducting layers may be made of the organic matrix material. The first and/or second organic semiconducting layer can be formed by vacuum or solution processing.

Alternatively or in addition, in an embodiment of the method, the first electrode is generated with first sub-electrode portions and the second electrode is generated with second sub-electrode portions, the plurality of sub-electrode portions being arranged in separated groups of overlapping sub-electrode portions, wherein each of the separated groups of overlapping sub-electrode portions is generated with at least one first sub-electrode portion overlapping with at least one second sub-electrode portion. The sub-electrode portions of both electrodes have a correspondence; either a one-to-one correspondence if the overlap area is larger than the non-overlapping area, or a one-to-one or a one-to-two neighboring (where the end can be even or odd) if the overlap area is smaller than the non-overlapping area. In the first case, the width of the sub-electrode of the second electrode is preferentially larger than the width of sub-electrode of the sub-electrode of the first electrode.

Preferentially, the sub-electrodes portions of both electrodes are arranged parallel to each other. Hereby, the optimum of lowest capacitance while keeping the series resistance low is provided.

In a further embodiment, the first doping material layer is generated such that the first sub-electrode portions are at least partially in direct contact with the first doping material layer and/or the second doping material layer is generated such that the second sub-electrode portions are at least partially in direct contact with the second doping material layer. Preferably, the first and/or second sub-electrode portions cover the first and/or second doping material layers completely, respectively.

In a preferred embodiment, the step of generating the first electrode and the electrode insulator comprises steps of depositing a first photoresist layer on the first organic semiconducting layer and/or on the first doping material layer, if applicable, defining an electrode area for the first electrode by patterning the first photoresist layer, thereby providing a first photoresist pattern, depositing a first conductive layer on the first photoresist pattern, depositing an insulating layer on the first conductive layer, and removing the first photoresist pattern in a lift-off process, thereby generating the first electrode and the electrode insulator.

In still a further embodiment, the step of generating the second electrode comprises steps of depositing a second photoresist layer on the first organic semiconducting layer, on the electrode insulator, and on the second doping material layer, if applicable, defining an electrode area for the second electrode by patterning the second photoresist layer, thereby providing a second photoresist pattern, depositing a second unpatterned organic semiconducting layer on the second photoresist pattern, depositing a second conductive layer on the second unpatterned organic semiconducting layer, and removing the second photoresist pattern in a lift-off process, thereby generating the second organic semiconducting layer and the second electrode. Alternatively, the deposition of the second electrode can be made after removing the patterned second photoresist layer.

For generating the first electrode and/or the second electrode patterning may involve curing a portion and removing an uncured portion. The first photoresist layer and/or the second photoresist layer can be formed as a double layer. The steps involving deposition, patterning and removing of the first and/or second photoresist layer can be done under normal or under an inert gas atmosphere. The first and/or second photoresist layer may be removed by an additional step of plasma etching.

In a preferred embodiment of the invention, the first electrode is provided with first sub-electrode portions and the second electrode is provided with second sub-electrode portions, the plurality of sub-electrode portions being arranged in separated groups of overlapping sub-electrode portions, wherein each of the separated groups of overlapping sub-electrode portions comprises at least one first sub-electrode portion overlapping with at least one second sub-electrode portion. The first and second semiconducting layers may or may not comprise the same organic matrix material. If this embodiment is implemented it is not necessary that the first and second organic semiconducting material comprise the same organic matrix material. Each of the at least one first sub-electrode portion and the at least one second sub-electrode portion is separated from a respective adjacent sub-electrode portion. Further, the at least one first sub-electrode portion and the at least one second sub-electrode portion may have different widths.

According to a preferred embodiment, a current path formed between the first and second electrodes via the first and second organic semiconducting layers is unipolar. Thus, the current through the layers is provided by only one type of charge carriers, namely electrons or holes.

In one preferred embodiment, the first and second organic semiconducting layers are made of a small molecule material.

In one preferred embodiment, the first and second organic semiconducting layers are made of polymeric materials.

In another preferred embodiment, the first and second organic semiconducting layers are in direct contact to each other.

According to a preferred embodiment, the second organic semiconducting layer is provided between the electrode insulator and the second electrode.

In still a further embodiment, the second electrode and at least one of the gate electrode and the first electrode are opaque for light. This ensures that ambient light does not affect the performance of the transistor.

According to a further embodiment, at least one electrode selected from the following group is made of a metal material: the first electrode, the second electrode, and the gate electrode.

The metal material may be gold or aluminum. Electrodes made of a metal material have a low resistance while a high power with a high frequency may be applied.

The dopant material is preferably an electrical dopant. Electrical dopants are classified in p-dopants and n-dopants. Electrical doping is well known in the field, exemplary literature references are Gao et al, Appl. Phys. Lett. V. 79, p.4040 (2001), Blochwitz et al, Appl. Phys. Lett. V. 73, p. 729 (1998), D'Andrade et al. App. Phys. Let. V. 83, p. 3858 (2003), Walzer et al. Chem. Rev. V. 107, p. 1233 (2007), US2005040390A1, US2009179189A. Exemplary p-dopants are: tetrafluoro-tetracyanoquinonedimethane (F4TCNQ); 2,2'-(perfluoronaphthalene-2,6-diylidene) dimalononitrile (F6TCNNQ); 2,2',2"-(cyclopropane-1,2,3-triylidene)tris(2-(p-cyanotetrafluorophenyl) acetonitrile). Preferred compounds are organic molecules containing cyano groups. Exemplary n-dopants are: acridine orange base (AOB); tetrakis (1,3,4,6,7,8-hexahydro-2H-pyrimido[1,2-a]pyrimidinato) ditungsten (II) (W2(hpp)4); 3,6-bis-(dimethyl amino)-acridine; bis(ethylene-dithio) tetrathiafulvalene (BEDT-TTF); oxocarbon; pseudooxocarbonderivatives.

According to another embodiment, an electronic switching device comprising an organic field effect transistor is provided.

It is preferred that the first electrode, the second electrode, and the electrode insulator are not permeable. The first and second electrode as well as the electrode insulator shall preferably be thick enough to form closed layers. Preferentially, first and second electrode as well as the electrode insulator are not interrupted or perforated or randomly interrupted, but rather litho-graphically patterned. Also, the electrode insulator does not allow any substantial tunneling of charge carriers through it under normal operating conditions.

Several advantages are provided, for instance the process allows for a reduction of overlap capacitances. Injection can be easily improved. Higher current densities are possible even at higher frequencies. In some embodiments, the high current can be further increased in asymmetrical devices by doping at least one of the contacts. The two photoresist layers comprising fluorinated photoresist and/or conventional (non-fluorinated) photoresist allows the precise and robust photolithographic patterning of completely different types of organic semiconducting materials without considerable affecting the organic semiconducting material. It enables the fabrication of complementary circuits (using n- and p-channel transistors). Also transistors can easily be made with gain of 10 times, 20 times or higher than conventional planar field effect transistors having high on/off ratio of more than $10^5$.

Preferred p-type semiconductors for the first and the second semiconducting layer and the first and second doping material layer (if provided as matrix/dopant system) are: pentacene, dinaphthothienothiophene (DNTT), further DNTT derivatives such as C10-DNTT (in general Cx-DNTT), Metal-Phthalocyanines (ZnPc,CuPc), perylenes such as Diindenoperylenes (DIP), Tetrapropyl-tetraphenyl-diindenoperylene (P4-PH4-DIP). Preferred n-type semiconductors for the first and the second semiconducting layer and the first and second doping material layer (if provided as matrix/dopant system) are: C60, C70, ZnPc, CuPc, F16CuPc, F4CuPc, Diindenoperylenes (DIP). The matrix material in a doped layer can for example also be tri-phenyl-diamine (TPD), 3-(N-Maleimidopropionyl)-biocytin (MPB), athophenanthroline (BPHEN), 2,4,7,9-tetraphenyl-1,10-phenanthroline (TPHEN), perylene-3,4,9,10-tetracarboxylie-3,4,9,10-dianhydride (PTCDA), naphthalene tetracarboxylic acid di-anhydride (NTCDA) etc. Further, the matrix material can be a polymer, for example p-type materials like poly(3-hexylthiophen-2,5-diyl) (P3HT), DIPs-pentacene, poly[2,5-bis(3-alkylthiophen-2-yl)thieno (3,2-b)thiophene] (PBTTT) or n-type materials like poly{[N,N9-bis(2-octyldodecyl)-naphthalene-1,4,5,8-bis(dicarboximide)-2,6-diyl]-alt-5,59-(2,29-bithiophene)} (P(NDI2OD-T2).

In another embodiment of the invention, a circuit is provided comprising:
at least a n-type VOFET comprising a n-type material and
at least a p-type VOFET comprising a p-type material.

Preferentially, the first and the second organic semiconducting layers consist each of one kind of semiconducting material. Alternatively or in addition, layers forming the electrodes can be shared between the n-type and p-type VOFET. The polarity of the VOFET may only be chosen by the polarity of the dopant (p or n). In this case the DSC material of p- or n-type VOFET may then be the same.

For materials which growth layers with high roughness (e.g. the roughness is of the order of the layer thickness itself), such as pentacene, it is preferred to keep the layers thin, preferably thinner than 60 nm, more preferably thinner than 40 nm. That ensures a good processability.

One aspect of the invention is to provide a dual layer photoresist and a method using a dual layer photoresist for patterning organic semiconducting materials. The dual layer photoresist is applied over a layer of an organic semiconducting material. The dual layer photoresist consists of a layer of fluorine based photoresist, which contacts the organic semiconducting material to be patterned, and a non-fluorine based photoresist. With that combination, it is possible to pattern the most different kinds of organic semiconducting materials; non limiting examples are pentacene, C60, ZnPc, etc.

The photolitographic patterning procedure may comprise:
depositing the fluorin based photoresist over the semiconducting layer;
depositing the (non-fluorine based) photoresist over the fluorin based photoresist layer;

illuminating (exposing) the fluorin and the non-fluorin based photoresit layer;
developing the non-fluorine based photoresist patter;
developing the fluorine based photoresist pattern;
depositing an additional organic or inorganic layer on top of the then patterned photoresist layer;
patterning the additional organic or inorganic layer by lift-off of the fluorin based and non-fluorine based photoresist.

All steps can be done at atmospheric pressure.

DESCRIPTION OF PREFERRED EMBODIMENTS OF THE INVENTION

Figure 2:
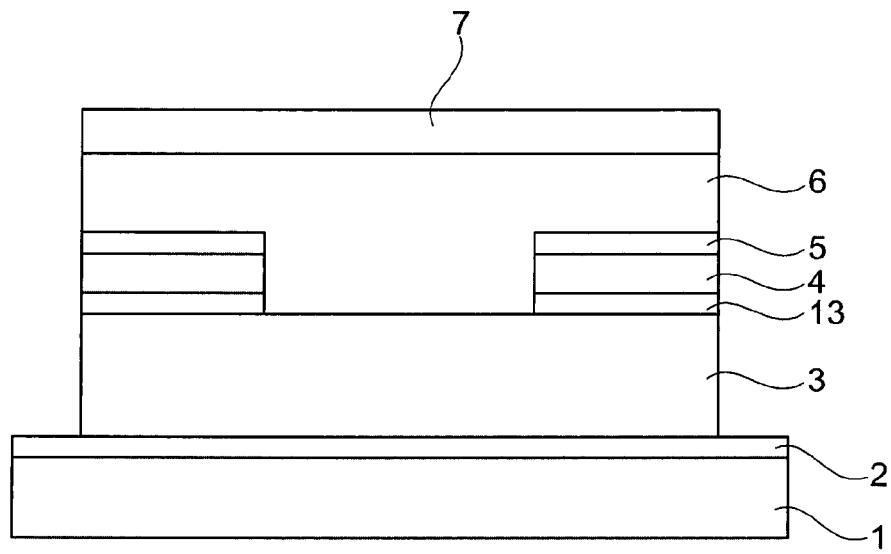
Figure 3:
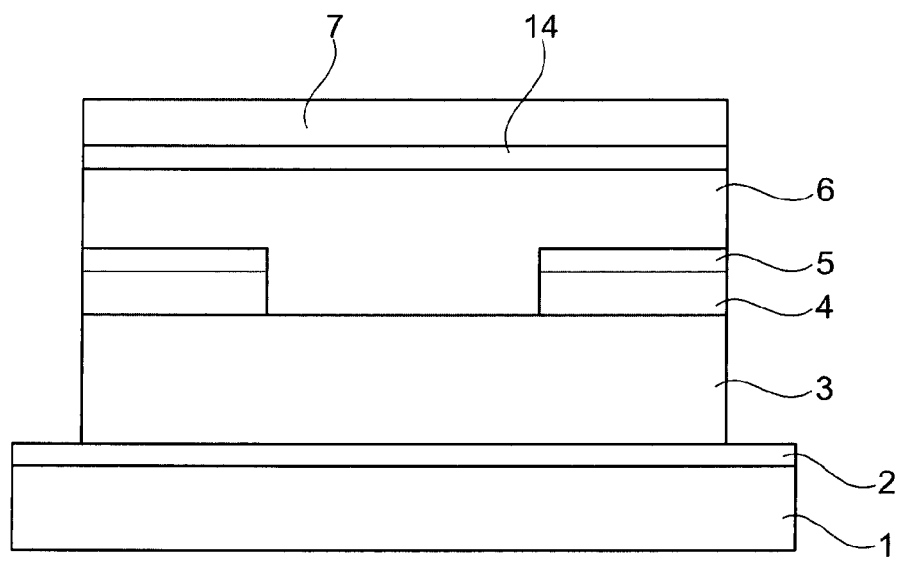
Figure 4:
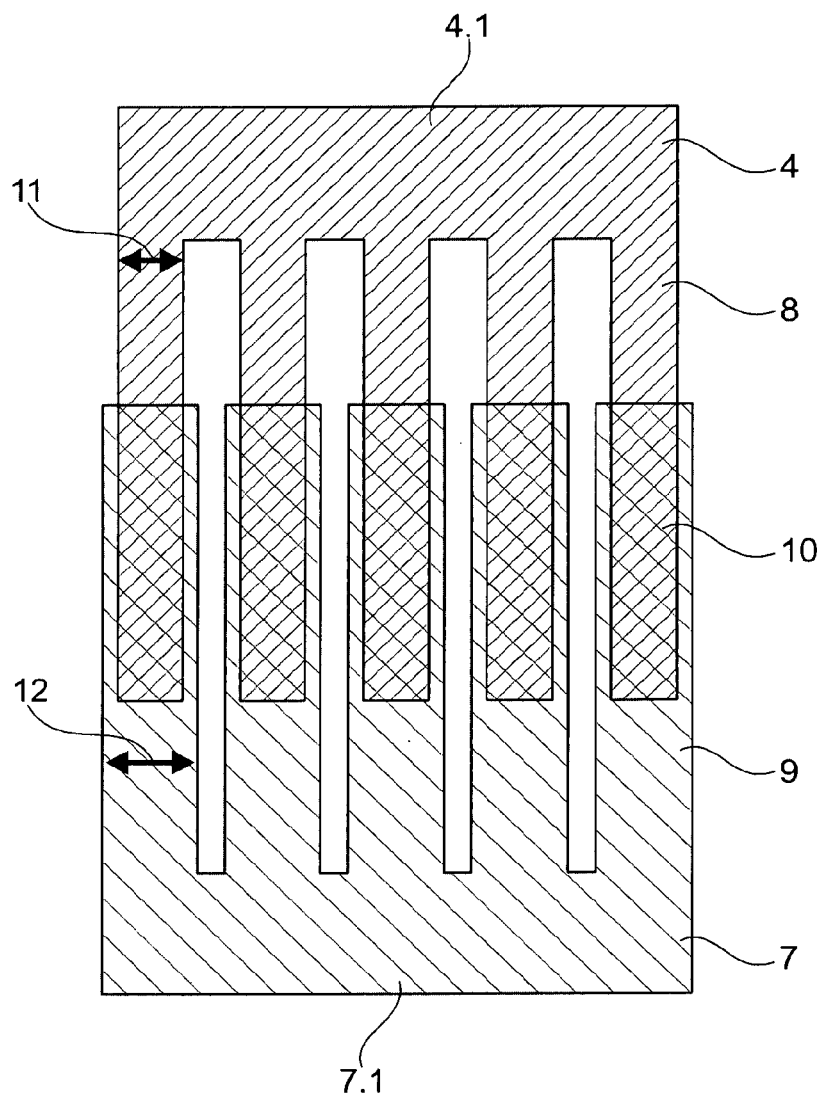
Figure 5:
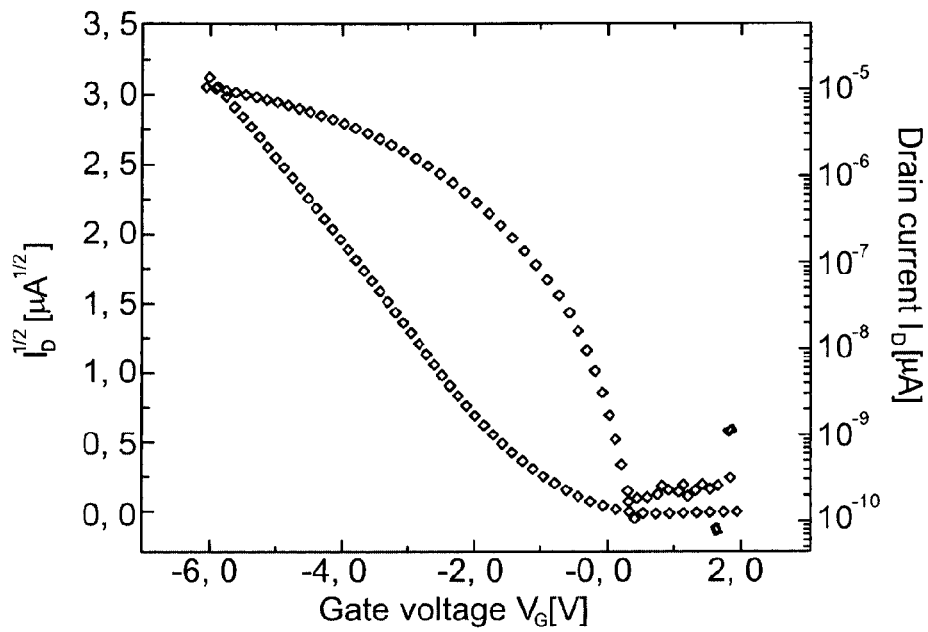
Figure 6:
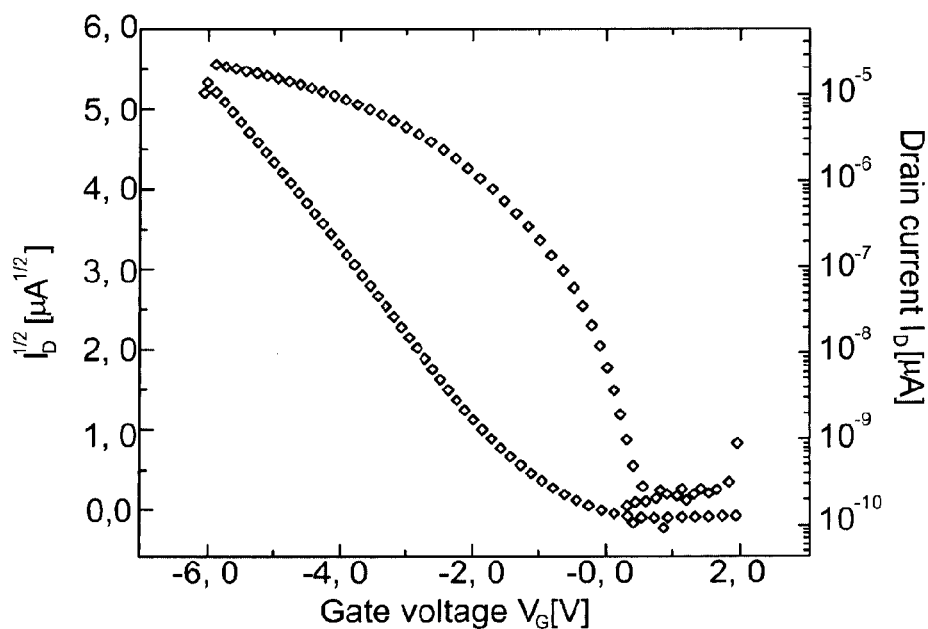

In the following the invention will be described in further detail, by way of example, with reference to different embodiments. In the figures show:

FIG. 1 a schematic representation of a vertical organic field effect transistor, FIG. 2 a schematic representation of another vertical organic field effect transistor, FIG. 3 a schematic representation of a further vertical organic field effect transistor, FIG. 4 a schematic representation of an electrode configuration, FIG. 5 a transfer characteristic line of a common vertical organic field effect transistor, and FIG. 6 a transfer characteristic line of a common vertical organic field effect transistor according to the embodiment shown in FIG. 1.

FIG. 1 shows a schematic representation of a vertical organic field effect transistor which comprises several layers. The transistor comprises a gate electrode (1) on which a gate insulator (2) is deposited. A first organic semiconducting layer (3) is arranged on the gate insulator (2). Further, a first electrode (4), an electrode insulator (5) and a second organic semiconducting layer (6) are provided. The first electrode (4) is arranged on a first doping material layer (13). A second electrode (7) is arranged on a second doping material layer (14). The transistor may be arranged on a substrate (not shown).

FIG. 2 shows a schematic representation of another transistor design. The transistor comprises also the gate electrode (1) with the gate insulator (2). The first organic semiconducting layer (3) is arranged on the gate insulator (2). The first electrode (4) is arranged on the first doping material layer (13). Further, the electrode insulator (5) and the second organic semiconducting layer (6) are provided. On top of the transistor the second electrode (7) is arranged on the second organic semiconducting layer (6).

FIG. 3 shows a schematic representation of a further vertical organic field effect transistor comprising the gate electrode (1) with the gate insulator (2). Further, the first organic semiconducting layer (3), the first electrode (4) and the electrode insulator (5) are provided. The second doping material layer (14) is arranged on the second organic semiconducting layer (6). Finally, the second electrode (7) is provided.

FIG. 4 shows a schematic representation of an electrode configuration. The first electrode (4) is provided with first sub-electrode portions (8) and the second electrode (7) is provided with second sub-electrode portions (9). The plurality of sub-electrode portions (8, 9) are arranged in separated groups of overlapping sub-electrode portions (10). Each of the separated groups of overlapping sub-electrode portions (10) comprises at least one first sub-electrode portion (8) overlapping with at least one second sub-electrode portion (9). The width (11) of the first sub-electrode portions (8) is optimized to be as small as possible to obtain the lowest possible capacitance between the first and second electrode (4, 7) but large enough to collect the current which is limited by the mobility of the charge carriers. Preferable ranges are between 100 μm and 1 μm or between 50 μm and 1 μm or between 20 and 0.5 μm. A width (12) of the second sub-electrode portions (9) is larger than the width (11) and is optimized for lowest capacitance (source-drain capacitance) while large enough to not considerably limit the current. Preferentially, portions (4.1) and (7.1) do not overlap. Preferable ranges are also between 100 μm and 1 μm or between 50 μm and 1 μm or between 20 and 0.5 μm. Preferentially, the sub-electrode portions (8, 9) are parallel to the each other (intra and inter-electrodes parallelism), because that leads to the lowest series resistance and highest overlap length (active area). The first and second sub-electrode portions (8, 9) can be at least partially arranged on the first and second doping material layer, respectively (not shown).

Following, a method for producing a transistor is disclosed. At first, a gate electrode (1) made of silicon (serving at the same time as substrate) is provided which also serves as a substrate for following layers. Typical substrate materials are silicon, glass, polyethylene, other common polymers for foils, gate materials: ITO, Pedot:PSS, Al, all air stable metals like Mo, Ta, Ag, Au, Cu, Al, Pa, Pl, carbon nanotubes, graphene. The gate electrode (1) may be doped. The gate electrode (1) is covered with the gate insulator (2) which is applied to the gate electrode (1). The gate insulator (2) may be formed from a metal oxide, for example SiO2, Al2O3 and HfO2. The metal oxide can be evaporated by vacuum thermal evaporation (VTE), sputtered or deposited using atomic layer deposition (ALD). Alternatively, the gate insulator (2) can be made from a polymer like PVA, PVP or Cytop. Polymers can be printed, coated, dipped or evaporated. The surface of the gate insulator (2) is cleaned in several steps before the first organic semiconducting layer (3) is applied. Also the oxide layers and other gate dielectric layers may be overcoated by an organic material, e.g. SAM described in U.S. Pat. No. 7,202,547 and U.S. Pat. No. 7,208,782. Afterwards, a first photoresist layer is deposited on the first organic semiconducting layer (3). The first photoresist layer comprises a special lacquer for protecting the organic material of the first organic semiconducting layer (3). After illuminating and processing (patterning by removing the uncured portion) the first photoresist layer, the first doping material layer (13) is deposited, for example by thermal evaporation. Then, a gold layer is vapor deposited to provide the first (source) electrode (4). In a next step, the electrode insulator (5) is deposited. For example, insulation is provided by a silicon dioxide layer that is deposited on the first electrode (4) by magnetron sputtering. Non required parts of the first photoresist layer, the first doping material layer (13), the first electrode (4) and the electrode insulator (5) are removed in a lift-off process. A second photoresist layer is deposited, illuminated and processed for structuring the second electrode (7). The second organic semiconducting layer (6) which preferentially comprises the same matrix material as the first organic semiconducting layer (3) is deposited on the second photoresist layer. On the second organic semiconducting layer (6) the second doping material layer (14) is deposited. Following, the second (drain) electrode (7) is deposited on the second doping material layer (14). Finally, non-required parts of the second photoresist layer, the second organic semiconducting layer (6), the second doping material layer (14) and the second electrode (7) are removed in a lift-off process, defining layers (6), (7) and (14). The first and second organic semiconducting layer (3, 6) may be either electron transport layers, comprising $C_{60}$, for example, or hole transport layers, comprising pentacene, for example.

In one example, an n-Si wafer with a 25 nm thick Al2O3 layer (by ALD from Namlab) is used as substrate and gate electrode and gate insulator. The wafer is cleaned with isopropanol (IPA) in a supersonic bath for 5 min and further ozone plasma etching for 10 min. The wafer is dipped in a solution of HMDS (Hexamethyldisilazane) for 30 min for enhancing adherence of the organic layer (this step is optional) with further spin rinsing IPA (1000 rpm, 30 s). 25 nm of Pentacene is deposited on the Al2O3 side, onto which a 1 µm thick layer of Ortho 310 from Orthogonal Inc. is spin coated at 30 s, and 3000 rpm. A second coating of Ma P 1210 from micro resist (30 s, 3000 rpm) follows on top of the Ortho 310 layer, forming a double layer photo resists. Both photoresist are processed under yellow light (lithography room), at 22° C. The sample rests for 10 min under yellow light (lithography room), 22° C.

Using a mask aligner (finger grid, finger length 200 µm, lateral dimensions are 30 and 50 µm), sample is exposed (e.g. to a Mercury lamp i-line (365 nm), dose 35 mJ/cm$^2$) for forming the source electrode for time=0.6 s and developed under yellow light (lithography room) at 22° C. in an aqueous solution of NaOH for 17 s (NaOH solution as ordered from supplier (micro-resist) under the acronym ma-D 331) for patterning the upper photoresist layer.

Afterwards, the sample is dipped into HFE 7300 for 3 minutes and 30 seconds with posterior rinsing in HFE7300 for 30 s (solvents from Orthogonal Inc.) for patterning the lower photoresist layer.

A 1 nm thick layer of F6TCNNQ is deposited by thermal evaporation serving as first doping material layer for improving charge carrier injection.

A 50 nm thick layer of Au is deposited as first electrode using VTE. A 200 nm thick layer of HfO2 is deposited by RF-sputtering. The patterning of the Au/HfO2 is done by Lift-Off in HFE 7300 for 12 h in a glovebox with nitrogen gas.

A second photolithographic step follows, with the spin coating of Ortho 310 at 30 s and 3000 rpm, and posterior coating of Ma-P 1210 at 30 s and 3000 rpm (Yellow light, 22° C.). The sample rests for 10 min. Again, using a mask aligner, the photoresist is exposed for 0.6 s (Mercury lamp i-line (365 nm), dose 35 mJ/cm$^2$, finger grid (finger grid, finger length 200 µm, lateral dimensions are 30 and 50 µm). The developing occurs in a solution of NaOH (NaOH as ordered from supplier under the acronym ma-D 331, yellow light (lithography room), 22° C.). The undeveloped photoresist is removed by dipping into HFE 7300 (3 min 30 s) and subsequent rinsing in HFE 7300 for 30 s (solvents from Orthogonal Inc.).

A 25 nm thick layer of Pentacene is deposited (VTE) on top, followed by a 1 nm thick layer of F6-TCNNQ and a 50 nm thick layer of Au as second electrode. A lift off process, in HFE 7300 during 12 h in a glovebox with nitrogen gas (diffuse ambient light, 22° C.), patterns the pentacene, the F6-TCNNQ and the Au layer.

FIGS. 5 and 6 show characteristic details of a commen VOFET (FIG. 5) and a transistor as shown in FIG. 1 and described above. In FIG. 6, the current flow is significantly higher than in FIG. 5. The ration between ON-current and OFF-current for both transistors is 10$^5$. It is surprising that the ON-current and OFF-current for both transistors are similar despite the fact that the higher amount of free charge carriers in the VOFET due to doping should increase the OFF-current.

The invention claimed is:

1. A method for producing an organic field effect transistor, the method comprising steps of:
   providing a gate electrode, and providing a gate insulator on the gate electrode, wherein the gate insulator is assigned to the gate electrode for electrical insulation on a substrate;
   depositing a first organic semiconducting layer on the gate insulator;
   depositing a first doping material layer on at least a portion of the first organic semiconducting layer;
   depositing a first electrode and an electrode insulator on at least a portion of the first doping material layer, wherein the electrode insulator is arranged on the first electrode for electrical insulation;
   depositing a second organic semiconducting layer on the first organic semiconducting layer and the electrode insulator,
   depositing a second doping material layer on the second organic semiconducting layer; and
   depositing a second electrode at least partially on the second doping material layer.

2. The method according to claim 1, wherein at least one of the step of depositing the first electrode and the electrode insulator, the step of depositing the first doping material layer, the step of depositing the second electrode, and the step of depositing the second doping material layer comprises a step of photo-lithographic structuring on the first and the second organic semiconducting layer, respectively.

3. The method according to claim 1, wherein at least one of the first doping material layer and the second doping material layer is deposited by physical vapour deposition.

4. The method according to claim 1, wherein at least one of the first doping material layer and the second doping material layer comprises a pure electrical dopant material, respectively.

5. The method according to claim 1, wherein at least one of the first doping material layer and the second doping material layer comprises a matrix material including an electrical dopant material, respectively.

6. The method according to claim 5, wherein the matrix material is an organic semiconducting material.

7. The method according to claim 1, wherein the first and second organic semiconducting layers comprise the same organic matrix material.

8. The method according to claim 1, wherein the first electrode comprises first sub-electrode portions and the second electrode comprises second sub-electrode portions, the plurality of sub-electrode portions being arranged in separated groups of overlapping sub-electrode portions, wherein each of the separated groups of overlapping sub-electrode portions is generated with at least one first sub-electrode portion overlapping with at least one second sub-electrode portion.

9. The method according to claim 8, wherein at least one of the first sub-electrode portions and the second sub-electrode portions are at least partially in direct contact with the first doping material layer or the second doping material layer, respectively.

10. The method according to claim 1, wherein the step of depositing the first electrode and the electrode insulator comprises:

depositing a first photoresist layer on the first organic semiconducting layer and/or the first doping material layer, if applicable;

defining an electrode area for the first electrode by patterning the first photoresist layer, thereby providing a first photoresist pattern;

depositing a first conductive layer on the first photoresist pattern;

depositing an insulating layer on the first conductive layer; and removing the first photoresist pattern in a lift-off process, thereby generating the first electrode and the electrode insulator.

11. The method according to claim 1, wherein the step of depositing the second electrode comprises:

depositing a second photoresist layer on the first organic semiconducting layer, on the electrode insulator, and on the second doping material layer, if applicable;

defining an electrode area for the second electrode by patterning the second photoresist layer, thereby providing a second photoresist pattern;

depositing a second unpatterned organic semiconducting layer on the second photoresist pattern;

depositing a second conductive layer on the second unpatterned organic semiconducting layer; and removing the second photoresist pattern in a lift-off process, thereby generating the second organic semiconducting layer and the second electrode.

12. An organic field effect transistor, comprising:

a first electrode and a second electrode, the first and second electrodes providing a source electrode and a drain electrode;

a gate electrode;

a gate insulator provided between the gate electrode and the first electrode;

an electrode insulator provided between the first and the second electrode;

a first organic semiconducting layer provided between the gate insulator and the first electrode;

a second organic semiconducting layer provided between the first organic semiconducting layer and the second electrode;

a first doping material layer which is provided between the first electrode and the first organic semiconducting layer and which is at least partially in direct contact with the first electrode; and a second doping material layer which is provided between the second electrode and the second organic semiconducting layer and which is at least partially in direct contact with the second electrode.

13. The transistor according to claim 12, wherein the first and second organic semiconducting layers are configured to transport charge carriers of the same type.

14. The transistor according to claim 12, wherein the first electrode comprises first sub-electrode portions and the second electrode comprises second sub-electrode portions, the plurality of sub-electrode portions being arranged in separated groups of overlapping sub-electrode portions, wherein each of the separated groups of overlapping sub-electrode portions comprises at least one first sub-electrode portion overlapping with at least one second sub-electrode portion.

15. The transistor according to claim 14, wherein at least one of the first doping material layer and the second doping material layer is at least partially in direct contact with the first sub-electrode portions or the second sub-electrode portions, respectively.

16. An electronic switching device, comprising an organic field effect transistor according to claim 12.

* * * * *